United States Patent [19]
Suzuki et al.

[11] Patent Number: 5,260,841
[45] Date of Patent: Nov. 9, 1993

[54] CLOCK EXTRACTING CIRCUIT

[75] Inventors: Hideto Suzuki; Hiroshi Tajima, both of Kanagawa, Japan

[73] Assignee: Sony Corporation, Tokyo, Japan

[21] Appl. No.: 706,205

[22] Filed: May 28, 1991

[30] Foreign Application Priority Data

May 31, 1990 [JP] Japan .................. 2-141972

[51] Int. Cl.$^5$ .............................. G11B 5/09
[52] U.S. Cl. ......................... 360/51; 360/60; 360/61
[58] Field of Search ............. 360/51, 52, 32, 61, 360/60, 39, 69, 27, 64; 331/25; 375/110

[56] References Cited

U.S. PATENT DOCUMENTS

| | | | |
|---|---|---|---|
| 4,356,518 | 10/1982 | Lemoine et al. | 360/51 |
| 4,864,433 | 9/1989 | Wakumura | 360/51 |
| 5,142,420 | 8/1992 | Tanaka et al. | 360/51 X |

Primary Examiner—Robert J. Pascal
Assistant Examiner—Ali Neyzari
Attorney, Agent, or Firm—William S. Frommer; Alvin Sinderbrand

[57] ABSTRACT

A clock extracting circuit for use in a data recorder or the like to extract clock pulses included in input data transmitted by a self-clocking system. The circuit comprises a data window generator for generating data window pulses each having a predetermined duration and rising or falling in synchronism with the rise and/or the fall of the input data; a voltage-controlled oscillator for generating reference clock pulses of a predetermined frequency in accordance with a control voltage; and a phase comparator for comparing the phase of the data window pulse with that of the reference clock pulse, then generating the control voltage proportional to the phase difference, and feeding back the control voltage to the voltage-controlled oscillator to thereby control the frequency of the reference clock polses. The duration of the window pulses and the frequency of the reference clock pulses are selectively switched in accordance with the input data transmission rate, so that a locked state is immediately achieved in response to any change of the transmission rate to consequently ensure stable extraction of the clock pulses included in the input data.

3 Claims, 3 Drawing Sheets

CLOCK EXTRACTING CIRCUIT

BACKGROUND OF THE INVENTION

1. Field of the Invention

The present invention relates to a clock extracting circuit adapted for use in a playback unit of a data recorder or the like to extract clock pulses included in input data transmitted by a self-clocking system.

2. Description of the Prior Art

In a data recorder for recording desired information data on a magnetic tape and reproducing the recorded data therefrom, it is generally customary to employ a self-clocking data transmission system which records modulated information data inclusive of clock pulses on a magnetic tape and, in a playback mode, extracts the clock pulses included in the reproduced digital signal. According to such system, the information data is obtained by demodulating the reproduced digital signal in conformity with the clock pulses.

More specifically, in a data playback unit 1 of a data recorder shown in FIG. 2, information data recorded on a magnetic tape 2 is reproduced therefrom by means of a head 3 and then is inputted as a reproduced RF signal $S_{RF}$ via a head amplifier 4 and an equalizer 5 to a binary encoder 6 having a comparator circuit configuration.

A predetermined reference voltage $V_{REF}$ is applied to the binary encoder 6 for converting the reproduced RF signal $S_{RF}$ into a binary value in accordance with the level of the reference voltage $V_{REF}$ to thereby obtain input data $DT_{IN}$, which is then supplied to an input terminal D of a D flip-flop 7 while being supplied also to a clock extracting circuit 8.

As a result, the clock extracting circuit 8 extracts clock pulses CK synchronized with the input data $DT_{IN}$ and feeds the extracted clock pulses CK to a clock terminal of the D flip-flop 7 while supplying the same also to an unshown digital signal processing circuit in a stage posterior thereto.

The D flip-flop 7 synchronizes the input data $DT_{IN}$ at the timing coincident with the clock pulses CK and then transmits the resultant input data $DT_{IN1}$ to the digital signal processing circuit.

Subsequently the digital signal processing circuit executes demodulation of the input data $DT_{IN1}$ in accordance with the timing of the clock pulses to thereby reproduce the information data.

As shown in FIG. 3, the conventional clock extracting circuit 8 is composed of a phase-locked loop (PLL) which comprises a data window generator 9, a phase comparator 10, a voltage-controlled oscillator (VCO) 11 and a low-pass filter (LPF) 12.

Practically, the input data $DT_{IN}$ (FIG. 4 (A)) is supplied to the data window generator 9, which then generates data window pulses $DT_{WD}$ (FIG. 4 (B)) having a predetermined duration and rising in synchronism with the leading edge and trailing edge of the input data $DT_{IN}$. Such data window pulses $DT_{WD}$ are inputted to the phase comparator 10.

The phase comparator 10 is supplied also with clock pulses CK (FIG. 4 (C)) which are substantially similar to the clock pulses generated by the VCO 11 and included in the input data $DT_{IN}$.

The phase comparator 10 generates an error voltage $V_{ER1}$ where each clock pulse CK rises in synchronism with a center instant $t_1$ in the duration (between instants $t_0$ and $t_2$) of the data window pulse $DT_{WD}$. The error voltage $V_{ER1}$ thus obtained is averaged via the LPF 12 to produce an average error voltage $V_{ER2}$, which is then used for controlling the oscillation frequency of the VCO 11.

In this manner, the clock extracting circuit 8 extracts the clock pulses CK synchronized in phase with the clock pulses included in the input data $DT_{IN}$, and then transmits such extracted clock pulses CK.

As shown in FIG. 5, the data window generator 9 comprises a delay circuit and an exclusive OR circuit 9B, wherein the delay circuit consists of a resistor R1, a capacitor C1 and an amplifier 9A. The data window generator 9 executes an exclusive OR operation between the input data $DT_{IN}$ and the data $DT_{IND}$ delayed for a predetermined time, thereby generating a data window pulse $DT_{WD}$.

The phase comparator 10 is so composed as shown in FIG. 6, wherein a first current source 10A, a first switch $SW_A$, a second switch $SW_B$ and a second current source 10B are connected in series to one another between a power source $V_{CC}$ and the ground, and the junction of the first and second switches $SW_A$ and $SW_B$ is grounded via a capacitor C2 while being connected to an amplifier 10C so that an error voltage $V_{ER1}$ is outputted therethrough.

Practically, in the phase comparator 10, first and second switch control signals $CNT_A$ and $CNT_B$ are generated in accordance with the data window pulse $DT_{WD}$ and the clock pulse CK, and the first and second switches $SW_A$ and $SW_B$ are selectively controlled by such signals to execute a phase comparison.

More specifically, the first and second switches $SW_A$ and $SW_B$ are controlled by the first and second switch control signals $CNT_A$ and $CNT_B$ in such a manner as to be held in an off-state during the time period where the data window pulse $DT_{WD}$ has a logical low level.

Meanwhile, during the time period (e.g., between instants $t_0$ and $t_1$) where the data window pulse $DT_{WD}$ has a logical high level and the clock pulse CK has a logical low level, the first switch $SW_A$ alone is held in an on-state to thereby charge the capacitor C2.

Furthermore, during the time period (e.g., between instants $t_1$ and $t_2$) where both the data window pulse $DT_{WD}$ and the clock pulse CK have a logical high level, the first switch $SW_A$ is held in an off-state while the second switch $SW_B$ is held in an on-state to thereby discharge the capacitor C2.

Thus, when the clock pulse CK and the data window pulse $DT_{WD}$ are coincident in phase with each other and the leading edge of the clock pulse CK is synchronous with the center instant of the high-level duration of the data window pulse $DT_{WD}$, the charge time and the discharge time of the capacitor C2 are mutually equal so that an error voltage $V_{ER1}$ of a value "0" is outputted via the amplifier 10C.

To the contrary, if the clock pulse CK and the window pulse $DT_{WD}$ have a phase deviation from each other, the charge time and the discharge time of the capacitor C2 are rendered unbalanced to consequently cause a variation in the average voltage across the capacitor C2, whereby an error voltage $V_{ER1}$ of a value corresponding to such voltage variation is outputted via the amplifier 10C.

In the clock extracting circuit 8, as described above, a control action is so performed that the clock pulse CK rises in synchronism with the center instant of the high-level duration of the data window pulse $DT_{WD}$, and therefore the clock pulses CK coincident in phase with the clock pulses included in the input data $DT_{IN}$ can be transmitted.

In the data playback unit 1 of the constitution mentioned, there is known an example where both the transport speed of a magnetic tape 2 and the rotational speed of a drum with a head 3 mounted thereon are so controlled as to maintain the relative speed of the head 3 to the magnetic tape 2 in the recording track direction, and the transmission rate of the input data $DT_{IN}$ is changed under such condition from a standard rate of 1/1 speed to a lower rate of ½, ¼, ⅛, 1/16 or 1/24 speed.

Suppose now that the transmission rate of the input data $DT_{IN}$ is changed from a 1/1 speed to a ½ speed for example. In case the input data $DT_{IN}$ transmitted at a ½ speed is to be locked by the high-level duration of the data window pulse $WT_{IN}$ conforming with a 1/1 speed, the charge and discharge of the capacitor C2 fail to be performed completely since the number of high-level pulses of the data window $DT_{WD}$ within a unitary time is reduced to ½, and therefore the time required for the PLL to be locked is rendered longer to consequently bring about a problem that the stability is deteriorated.

OBJECT AND SUMMARY OF THE INVENTION

It is an object of the present invention to provide an improved clock extracting circuit which is capable of achieving a locked state immediately in response to any change of an input data transmission rate and extracting clock pulses included in the input data transmitted by a self-clocking system.

According to one aspect of the present invention, there is provided a clock extracting circuit comprising a window generator for generating data window pulses each having a predetermined duration and rising or falling in synchronism with the rise and/or the fall of the input data; a voltage-controlled oscillator for generating reference clock pulses of a predetermined frequency in accordance with a control voltage; and a phase comparator for comparing the phase of the data window pulse with that of the reference clock pulse, then generating the control voltage proportional to the phase difference, and feeding back the control voltage to the voltage-controlled oscillator to thereby control the frequency of the reference clock pulses. In this clock extracting circuit, the duration of the data window pulses and the frequency of the reference clock pulses are selectively switched in accordance with the input data transmission rate.

The above and other features and advantages of the present invention will become apparatus from the following description which will be given with reference to the illustrative accompanying drawings.

DESCRIPTION OF THE PREFERRED EMBODIMENT

Hereinafter an exemplary embodiment of the present invention will be described in detail with reference to the accompanying drawings.

Figure 1:
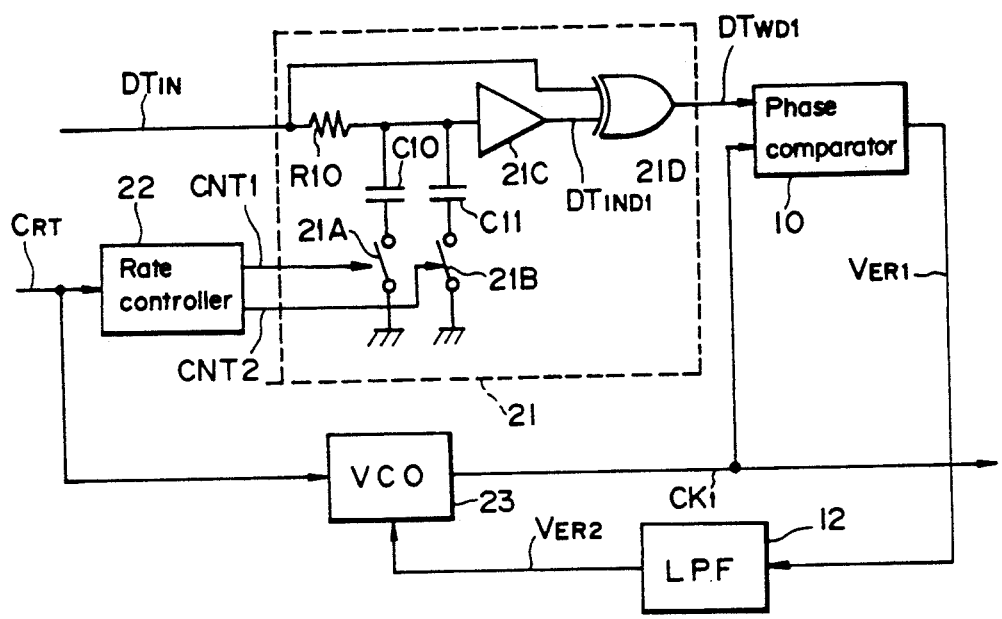
FIG. 1 is a block diagram of an exemplary clock extracting circuit embodying the present invention.
Figure 2:
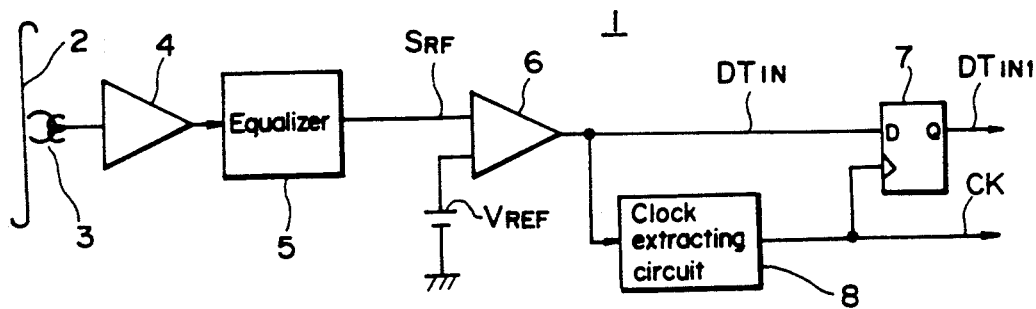
FIG. 2 is a block diagram of a data playback unit employed in a data recorder.
Figure 3:
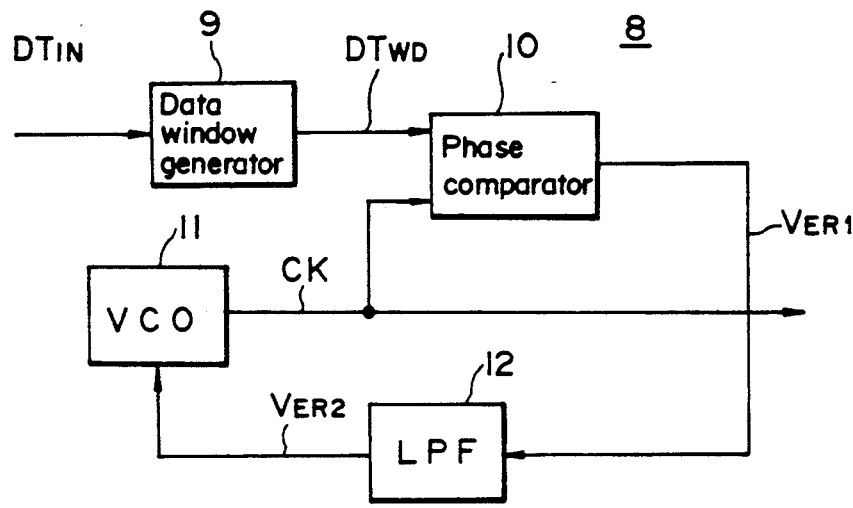
FIG. 3 is a block diagram of a conventional clock extracting circuit.
Figure 4:
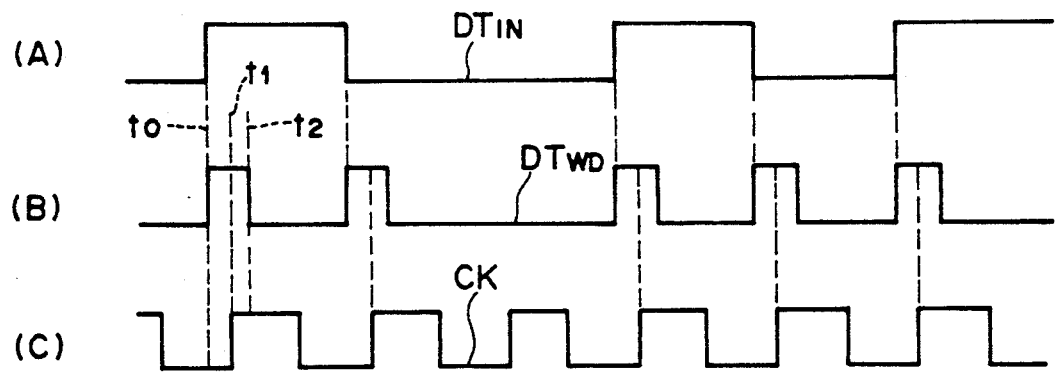
FIGS. 4A–4C are timing charts for explaining the operation of the circuit shown in FIG. 3.
Figure 5:
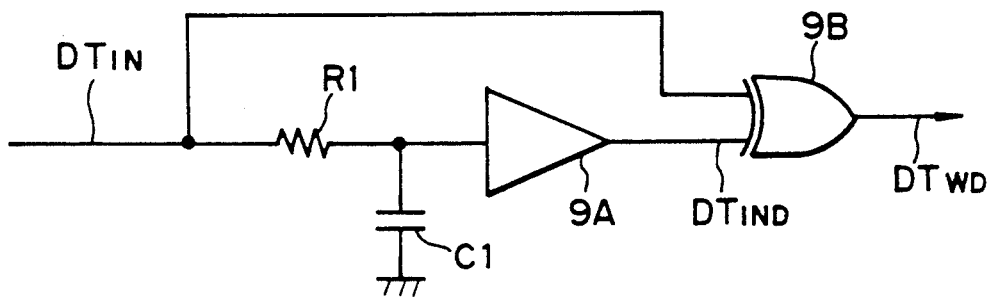
FIG. 5 is a connection diagram of a data window generator.
Figure 6:
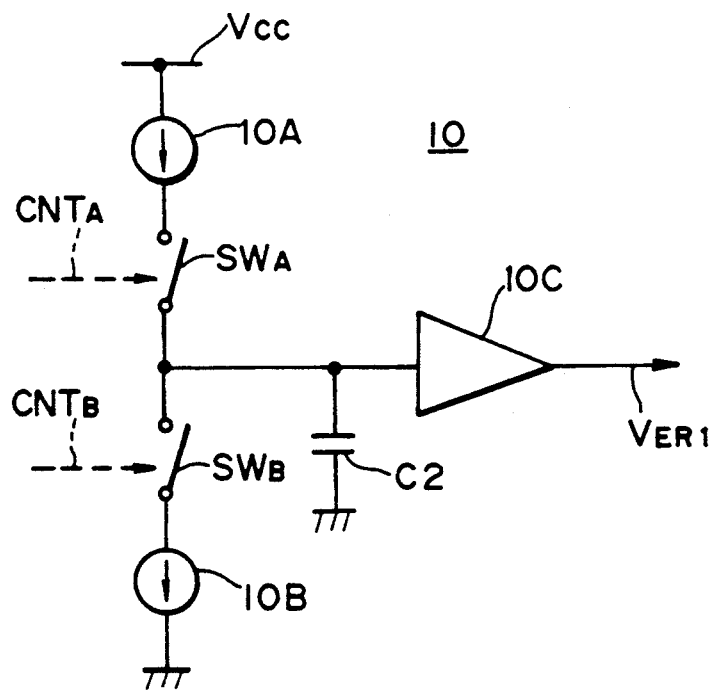
FIG. 6 is a connection diagram of a phase comparator.

In FIG. 1 where the same reference numerals and symbols as those used in FIG. 3 denote the same or corresponding components, there is shown a clock extracting circuit 20 according to the present invention, and input data $DT_{IN}$ is fed to a data window generator 21.

The data window generator 21 comprises a delay circuit and an exclusive OR circuit 21D, wherein the delay circuit consists of a resistor R10, first and second capacitors C10 and C11 grounded at one end thereof via first and second switches 21A and 21B respectively, and an amplifier 21. An exclusive OR operation is executed between the input data $DT_{IN}$ and the data $DT_{IND1}$ delayed for a predetermined time therefrom, whereby a data window pulse $DT_{WD1}$ is generated.

In this embodiment, a transmission rate $C_{RT}$ determined selectively in accordance with the input data $DT_{IN}$ is inputted to a rate controller 22 via an unshown system controller or the like.

The rate controller 22 generates control signals CNT1 and CNT2 in accordance with the transmission rate $C_{RT}$ and selectively controls the first and second switches 21A and 21B in the data window generator 21.

Consequently, the delay value of the delayed data $DT_{IND1}$ outputted from the amplifier 21C is switched on the basis of the capacitance of the capacitor, whereby the high-level duration of the data window pulse $DT_{WD1}$ is selectively changed in conformity with the data transmission rate $C_{RT}$.

When the transmission rate $C_{RT}$ of the input data $DT_{IN}$ is changed from a standard 1/1 speed to a ½ speed, the clock pulses $CK_1$ can be locked to the input data $DT_{IN}$ by the data window pulses $DT_{WD1}$ conforming with the transmission rate $C_{RT}$ of a ½ speed, hence locking the PLL immediately and achieving stable extraction of the clock pulses included in the input data $DT_{IN}$.

In the clock extracting circuit 20, the transmission rate $C_{RT}$ of the input data $DT_{IN}$ is supplied also to the VCO 23, so that occurrence of false locking or the like can be prevented by selectively controlling the frequency of the clock pulses $CK_1$ in conformity with the relevant transmission rate $C_{RT}$, thereby extracting the self-clock pulses stably from the input data $DT_{IN}$ to consequently obtain the desired clock pulses $CK_1$.

According to the constitution mentioned above, both the duration of the data window pulses and the frequency of the reference clock pulses are selectively switched in accordance with the transmission rate of the input data, so that it becomes possible to lock the PLL immediately in response to any change of the transmission rate to eventually ensure stable extraction of the clock pulses included in the input data.

The embodiment mentioned above represents an exemplary case where each window pulse rises in synchronism with the leading edge and the trailing edge of the input data $DT_{IN}$. However, it is to be understood that the window pulse is not limited to such example alone. And the circuit may be so modified that the window pulse rises in synchronism with either the leading or trailing edge of the input data $DT_{IN}$ or falls in synchronism therewith.

Although, in the above embodiment, the window pulse rises in synchronism with the leading and trailing edges of the input data $DT_{IN}$, the timing of such synchronism may be so changed that the window pulse rises with a predetermined delay from the reference edge of the input data $DT_{IN}$.

Also differing from the above embodiment where the duration of the window pulse is changed by selectively switching a plurality of capacitors in the delay circuit, the delay value may be changed by controlling a varactor diode or the like.

Further, in the above embodiment, each window pulse is generated by executing an exclusive OR operation between the input data and the data delayed therefrom. However, generation of the window pulse is not limited to such example alone. And, if the circuit is so modified as to generate a window pulse on the basis of the reference edge of the input data $DT_{IN}$ and to change the duration of such pulse, a desired effect similar to the aforementioned can be realized even by the use of a multivibrator or the like.

Although the above embodiment represents an exemplary case of applying the present invention to a playback unit in a data recorder, it is a matter of course that the present invention is not limited to such example alone and may be widely applied to any device for extraction of clock pulses included in input data transmitted by a self-clocking system.

As described hereinabove, in controlling the data window pulses of a predetermined duration generated on the basis of the input data and the frequency of the voltage-controlled reference clock pulses in accordance with the phase thereof, the present invention is so contrived that the duration of the data window pulses and the frequency of the reference clock pulses are selectively switched in accordance with the input data transmission rate, whereby a locked state is immediately achieved in response to any change of the transmission rate to consequently ensure stable extraction of the clock pulses included in the input data.

What is claimed is:

1. A clock extracting circuit for extracting clock pulses from input data transmitted by a self-clocking system, said clock extracting circuit comprising:

means receiving a signal representative of a selected transmission rate of said input data selected from among a plurality of transmission rates for generating corresponding control signals therefrom;

data window generator means receiving said input data and the corresponding control signals and, in response to the received control signals, for generating data window pulses each having a predetermined duration corresponding to the received control signals and being in synchronism with said input data;

voltage-controlled oscillator means for generating reference clock pulses having a predetermined frequency in accordance with an error voltage signal and the selected transmission rate signal; and phase comparator means for comparing the phase of at least one of said data window pulses from said data window generator means with that of at least one of said reference clock pulses and for generating said error voltage signal based on a phase difference therebetween, and for supplying said error voltage signal to said voltage-controlled oscillator means so as to control the frequency of said reference clock pulses.

2. A clock extracting circuit according to claim 1, wherein said means for receiving said input data and for generating data window pulses includes a delay circuit and an exclusive OR circuit.

3. A clock extracting circuit according to claim 2, wherein said delay circuit includes a plurality of switches each controlled in accordance with said control signals and a plurality of capacitors each respectively coupled to one of said switches.

* * * * *